US012805144B2

(12) United States Patent
Lee et al.

(10) Patent No.: US 12,805,144 B2
(45) Date of Patent: Nov. 17, 2026

(54) DISPLAY APPARATUS HAVING COLOR FILTERS

(71) Applicant: LG Display Co., Ltd., Seoul (KR)

(72) Inventors: Jung Eun Lee, Paju-si (KR); Sung Woo Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 551 days.

(21) Appl. No.: 18/082,026

(22) Filed: Dec. 15, 2022

(65) Prior Publication Data

US 2023/0217772 A1 Jul. 6, 2023

(30) Foreign Application Priority Data

Jan. 1, 2022 (KR) ........................ 10-2022-0000002
Jul. 7, 2022 (KR) ........................ 10-2022-0083746

(51) Int. Cl.
*H10K 59/121* (2023.01)
*H10K 59/38* (2023.01)
(Continued)

(52) U.S. Cl.
CPC ........... *H10K 59/38* (2023.02); *H10K 59/121* (2023.02); *H10D 30/673* (2025.01);
(Continued)

(58) Field of Classification Search
CPC .... H10K 59/38; H10K 59/121; H10K 71/135; H10K 71/13; H10K 59/122; H10K 59/35;
(Continued)

(56) References Cited

U.S. PATENT DOCUMENTS

2009/0160322 A1* 6/2009 Yoshida ............... H10K 59/173
313/504
2016/0043150 A1* 2/2016 Wang .................. H10K 59/353
257/40

(Continued)

FOREIGN PATENT DOCUMENTS

CN 108628030 A 10/2018
CN 111312758 A 6/2020

(Continued)

OTHER PUBLICATIONS

Ministry of Intellectual Property of Korea, Office Action, Korean Patent Application No. 10-2022-0083746, Dec. 19, 2025, 26 pages.

*Primary Examiner* — Matthew C Landau
*Assistant Examiner* — David W Ward
(74) *Attorney, Agent, or Firm* — Fenwick & West LLP

(57) ABSTRACT

A display apparatus including color filters is disclosed. The display apparatus may comprise a device substrate including pixel areas. A light-emitting device may be disposed on each pixel area. An encapsulating layer covering the light-emitting devices may be disposed on the device substrate. The color filters may be disposed on the encapsulating layer. For example, separating dams defining openings overlapping with the light-emitting devices may be disposed on the encapsulating layer. The pixel areas disposed in a first direction may display the same color. Some of the separating dams extending in a second direction that is different from the first direction between the pixel areas may have a relatively short length. Thus, in the display apparatus, the volume difference between the color filters may be reduced.

19 Claims, 10 Drawing Sheets

(51) Int. Cl.

| | |
|---|---|
| *H10D 30/67* | (2025.01) |
| *H10D 64/23* | (2025.01) |
| *H10D 86/40* | (2025.01) |
| *H10D 86/60* | (2025.01) |
| *H10K 71/13* | (2023.01) |

(52) U.S. Cl.
CPC ........... *H10D 64/251* (2025.01); *H10D 86/40* (2025.01); *H10D 86/60* (2025.01); *H10K 71/135* (2023.02)

(58) Field of Classification Search
CPC .. H10K 59/351; H10K 59/353; H10D 30/673; H10D 86/40; H10D 86/60; H10D 64/251
See application file for complete search history.

(56) References Cited

U.S. PATENT DOCUMENTS

| | | | | |
|---|---|---|---|---|
| 2018/0275471 | A1 | 9/2018 | Park et al. | |
| 2020/0185471 | A1 | 6/2020 | Lee et al. | |
| 2021/0167147 | A1* | 6/2021 | Nakatani .............. | H10K 59/123 |
| 2021/0288120 | A1* | 9/2021 | Zhao .................... | H10K 59/353 |
| 2023/0263034 | A1* | 8/2023 | Kim ...................... | H10K 59/38<br>257/91 |

FOREIGN PATENT DOCUMENTS

| | | | |
|---|---|---|---|
| CN | 112885871 | A | 6/2021 |
| KR | 10-2020-0001767 | A | 1/2020 |
| KR | 10-2020-0071428 | A | 6/2020 |
| KR | 10-2021-0067904 | A | 6/2021 |
| KR | 10-2021-0081023 | A | 7/2021 |

* cited by examiner

DISPLAY APPARATUS HAVING COLOR FILTERS

CROSS-REFERENCE TO RELATED APPLICATIONS

This application claims the benefit of Republic of Korea Patent Application No. 10-2022-0000002 filed on Jan. 1, 2022, and Republic of Korea Patent Application No. 10-2022-0083746 filed on Jul. 7, 2022, each of which are hereby incorporated by reference in its entirety.

BACKGROUND

Field of Technology

The present disclosure relates to a display apparatus in which a color filter is disposed on each pixel area.

Discussion of the Related Art

Generally, a display apparatus displays an image to user. For example, the display apparatus may include light-emitting devices. Each of the light-emitting devices may emit light displaying a specific color. For example, each of the light-emitting devices may include a light-emitting layer disposed between a first electrode and a second electrode.

The display apparatus may include color filters disposed on the light-emitting devices. For example, the display apparatus displays the image made of various colors by using the color filters. The color filters may be disposed on an encapsulating unit covering the light-emitting devices. For example, the color filters may be formed by an ink-jet process. Separating dams defining a formation region of each color filter may be disposed on the encapsulating unit.

In the display apparatus, pixel areas disposed side by side in a first direction may realize the same color. The color filters disposed on the pixel areas which display the same color may be simultaneously formed. For example, in the display apparatus, the color filters may be formed by using a plurality of nozzle arranged in the first direction. However, in a method of forming the display apparatus, the number of the nozzles arranged on the region defined by the separating dams may be different. For example, in the method of forming the display apparatus, the volume of the color filters may vary according to the amount of material injected into the region defined by the separating dams. Thus, in the display apparatus, a color deviation due to a volume difference of the color filters may occur.

SUMMARY

Accordingly, the present disclosure is directed to a display apparatus that substantially obviates one or more problems due to limitations and disadvantages of the related art.

An object of the present disclosure is to provide a display apparatus capable of reducing the volume difference of the color filters, which are disposed on the pixel areas that display the same color.

Another object of the present disclosure is to provide a display apparatus capable of reducing the difference in the amount of material injected into the region defined by the separating dams for the formation of the color filters.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising: a plurality of first separation dams extending in a first direction, the plurality of first separation dams spaced apart from each other in a second direction that is different from the first direction; a first pixel column including a plurality of first pixel areas between the plurality of first separation dams, the plurality of first pixel areas arranged along the first direction between the plurality of first separation dams; a plurality of first dam patterns between the plurality of first pixel areas, the plurality of first dam patterns extending in the second direction; a plurality of second dam patterns between the plurality of first pixel areas, the plurality of second dam patterns extending in the second direction and each of the plurality of second dam patterns having a length that is less than a length of each of the plurality of first dam patterns; and a plurality of first color filters between the plurality of first separation dams, the plurality of first dam patterns, and the plurality of second dam patterns, wherein each of the plurality of first dam patterns is in contact with a pair of first separation dams from the plurality of first separation dams, the pair of first separation dams adjacent to each other in the second direction.

In one embodiment, a display apparatus comprises: a plurality of light-emitting devices on a device substrate; an encapsulating layer on the plurality of light-emitting devices; a plurality of separating dams on the encapsulating layer, the plurality of separating dams including a plurality of first separation dams extending in a first direction and a plurality of second separation dams extending in a second direction that is different from the first direction, the plurality of second separation dams between the plurality of first separation dams; and a plurality of color filters between the plurality of separating dams, the plurality of color filters overlapping the plurality of light-emitting devices, wherein the plurality of second separation dams include a plurality of first dam patterns and a plurality of second dam patterns between the plurality of first dam patterns in the first direction, wherein each of the plurality of first dam patterns has a thickness that is greater than a thickness of each of the plurality of color filters, and each of the plurality of second dam patterns has a thickness that is less than the thickness of each of the plurality of first dam patterns.

In one embodiment, a display apparatus comprises: a substrate; a pair of first separation dams on the substrate, the pair of first separation dams extending in a first direction and spaced apart from each other in a second direction that is different from the first direction; a plurality of second separation dams between the pair of the first separation dams, each of the plurality of second separation dams extending between the pair of first separation dams; a plurality of pixel areas arranged in the first direction and configured to emit a same color of light, each pixel area from the plurality of pixel areas between a corresponding portion of the pair of first separation dams and a pair of second separation dams from the plurality of second separation dams; and a plurality of color filters on the plurality of pixel areas, wherein the plurality of second separation dams include: a plurality of first dam patterns, each first dam pattern from the plurality of first dam patterns including a first end that is connected to one first separation dam from the pair of first separation dams and a second end that is connected to another first separation dam from the pair of first separation dams; and a plurality of second dam patterns, each second dam pattern from the plurality of second dam patterns including a first end that is connected to the one first separation dam from the pair of first separation dams and a second end that is not connected to the other first separation dam from the pair of first separation dams, and wherein each of the plurality of color filters is in contact with the pair of first separation dams, at least one first dam pattern from the plurality of first dam patterns, and at least one second dam pattern from the plurality of second dam patterns.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
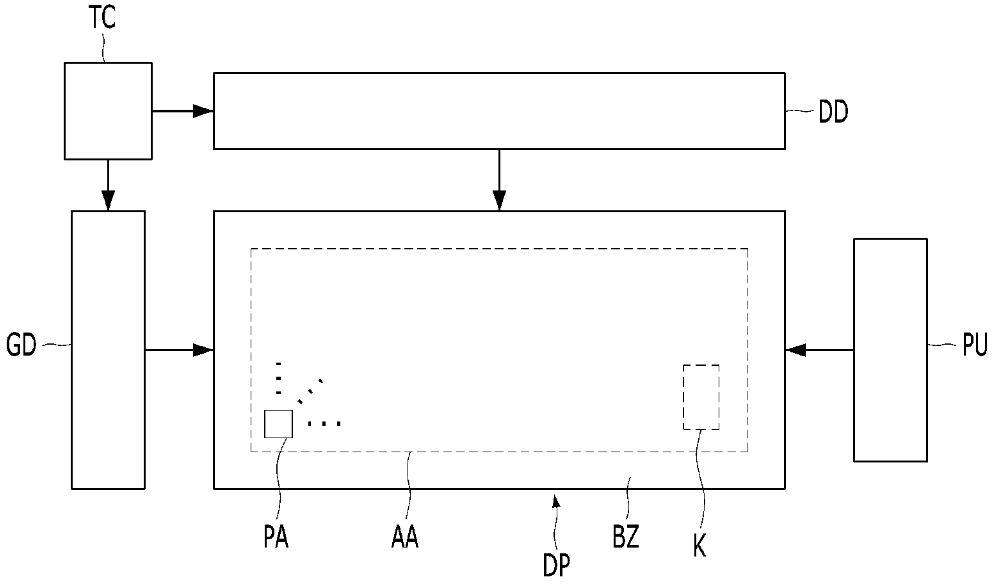
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical spirit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical spirit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
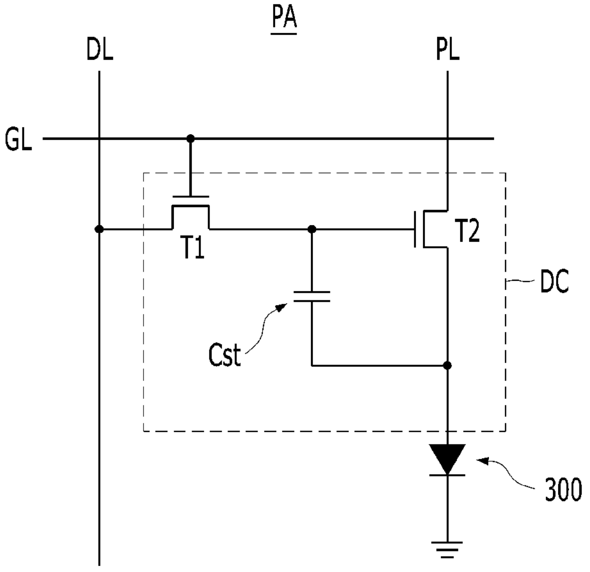
FIG. 2 is a view showing a circuit of a unit pixel area in the display apparatus according to an embodiment of the present disclosure.
Figure 3:
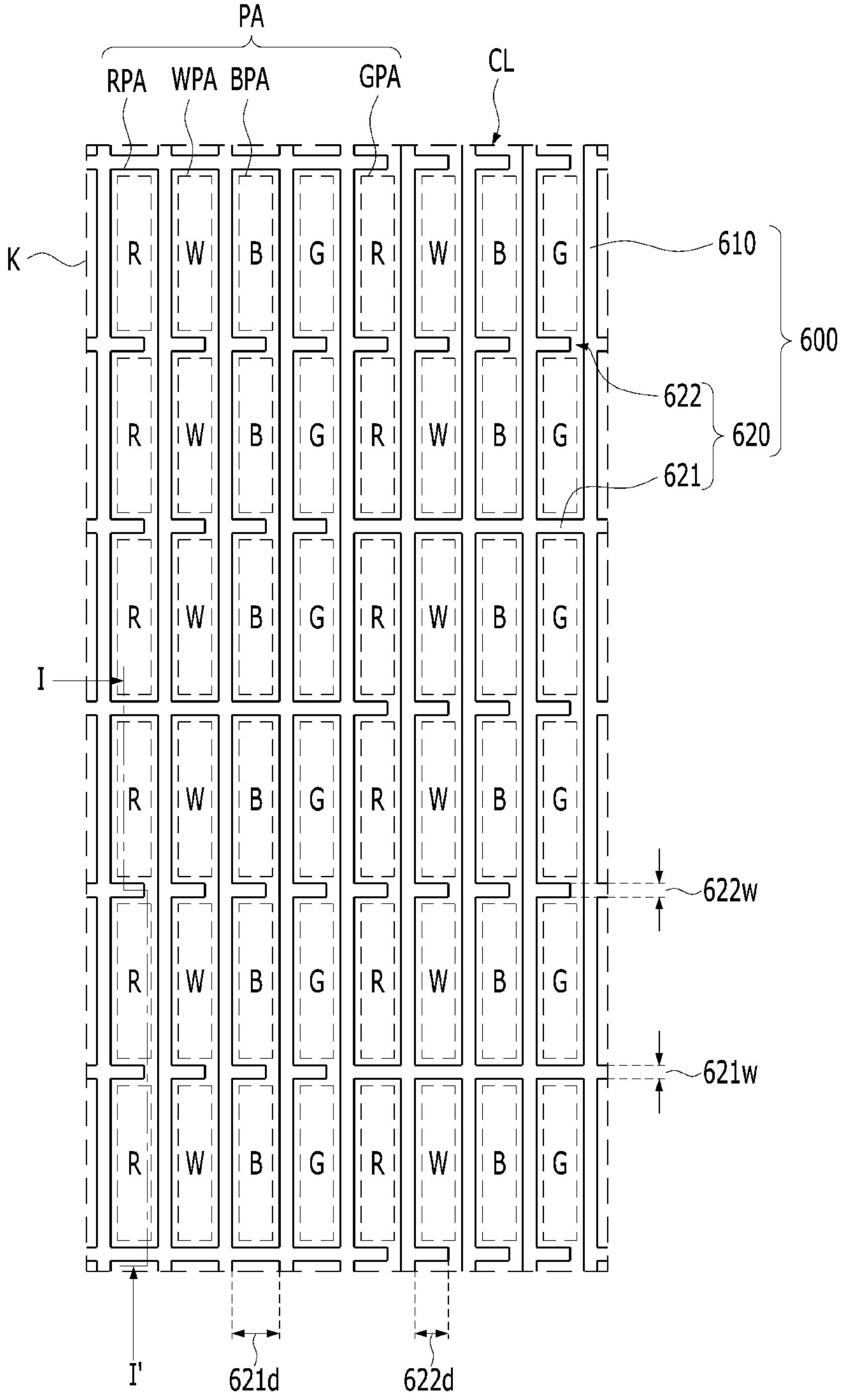
FIG. 3 is a view showing separating dams and color filters in the display apparatus according to an embodiment of the present disclosure.
Figure 4:
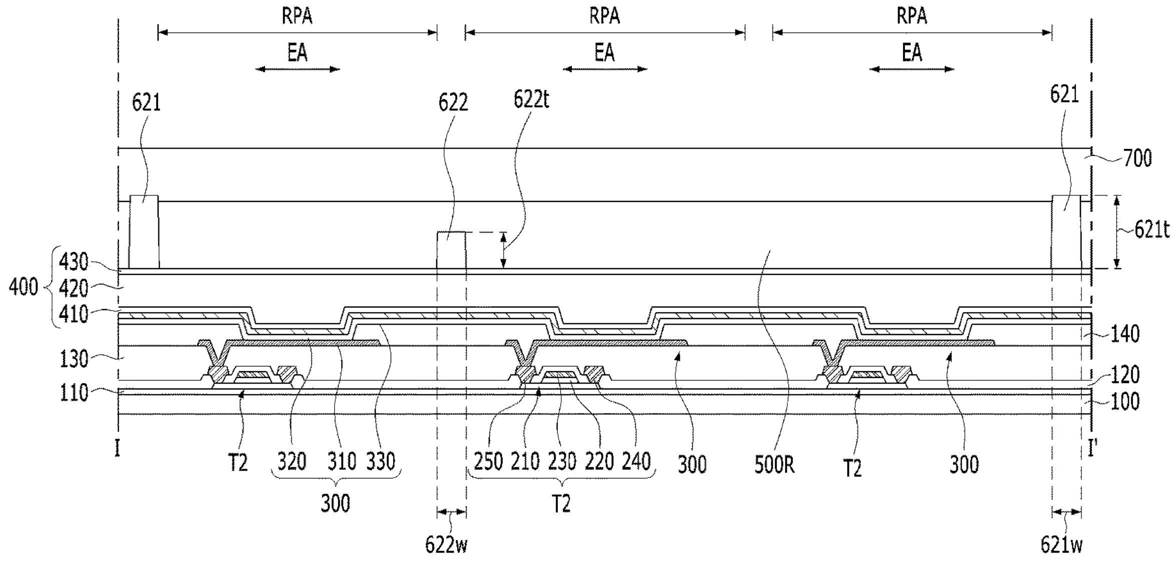
FIG. 4 is a view taken along I-I' of FIG. 3 according to the embodiment of the present disclosure.

FIG. 1 is a view schematically showing a display apparatus according to an embodiment of the present disclosure. FIG. 2 is a view showing a circuit of a unit pixel area in the display apparatus according to an embodiment of the present disclosure. FIG. 3 is a view showing separating dams and color filters in the display apparatus according to an embodiment of the present disclosure. FIG. 4 is a view taken along I-I' of FIG. 3 according to an embodiment of the present disclosure.

Referring to FIGS. 1 to 4, the display apparatus according to the embodiment of the present disclosure may include a display panel DP, a data driver DD, a gate driver GD, a timing controller TC, and a power unit PU (e.g., a circuit).

The display panel DP may generate an image being provided to a user. For example, the display panel DP may include an active area AA and a bezel area BZ. The active area AA may include a plurality of pixel areas PA. The data driver DD, the gate driver GD, the timing controller TC and the power unit PU may provide a signal for the operation of each pixel area PA through signal lines DL, GL and PL. The signal lines DL, GL and PL may include data lines DL, gate lines GL and power voltage supply lines PL. For example, the data driver DD may apply a data signal to each pixel area PA through the data lines DL, the gate driver GD may apply a gate signal to each pixel area PA through the gate lines GL, and the power unit PU may supply a power voltage to each pixel area PA through the power voltage supply lines PL. The timing controller TC may control the data driver DD and the gate driver GD. For example, the data driver DD may receive digital video data and a source timing control signal from the timing controller TC, and the gate driver GD may receive clock signals, reset clock signals and start signals from the timing controller TC.

Each of the pixel areas PA may display a specific color. For example, a light-emitting device 300 may be disposed in each pixel area PA. The light-emitting device 300 may emit light displaying a specific color. For example, the light-emitting device 300 may include a first electrode 310, a light-emitting layer 320 and a second electrode 330, which are sequentially stacked on a device substrate 100. The device substrate 100 may include an insulating material. For example, the device substrate 100 may include glass or plastic.

The first electrode 310 may include a conductive material. The first electrode 310 may have a high reflectance. For example, the first electrode 310 may include a metal, such as aluminum (Al), titanium (Ti), copper (Cu), molybdenum (Mo), tantalum (Ta), chromium (Cr) and tungsten (W), or an alloy thereof. The first electrode 310 may have a single-layer structure or a multi-layer structure. For example, the first electrode 310 may have a structure in which a reflective electrode made of a metal is disposed between the transparent conductive layers made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may have a transmittance higher than the first electrode 310. For example, the second electrode 330 may be a transparent electrode made of a transparent conductive material. The second electrode 330 may include a transparent conductive oxide, such as ITO, IZO and AZO. Thus, in the display apparatus according to the embodiment of the present disclosure, the light generated by the light-emitting layer 320 may be emitted outside through the second electrode 330.

The pixel driving circuit DC electrically connected to the light-emitting device 300 may be disposed in each pixel area PA. The operation of the light-emitting device 300 in each pixel area PA may be controlled by the pixel driving circuit DC of the corresponding pixel area PA. The pixel driving circuit DC of each pixel area PA may be electrically connected to one of the data lines DL, one of the gate lines GL, and one of the power voltage supply lines PL. For example, the pixel driving circuit DC of each pixel area PA may supply a driving current corresponding to the data signal to the light-emitting device 300 of the corresponding pixel area PA according to the gate signal. The driving current generated by the pixel driving circuit DC of each pixel area PA may be applied to the light-emitting device 300 of the corresponding pixel area PA for one frame. For example, the pixel driving circuit DC of each pixel area PA may include a first thin film transistor T1, a second thin film transistor T2 and a storage capacitor Cst.

The first thin film transistor T1 may transmit the data signal to the second thin film transistor T2 according to the gate signal. The second thin film transistor T2 may generate the driving current corresponding to the data signal. For example, the second thin film transistor T2 may be a driving thin film transistor. The second thin film transistor T2 may include a semiconductor pattern 210, a gate insulating layer 220, a gate electrode 230, a source electrode 240 and a drain electrode 250.

The semiconductor pattern 210 may include a semiconductor material. For example, the semiconductor pattern 210 may include at least one of amorphous silicon, polycrystalline silicon, and an oxide semiconductor. The semiconductor pattern 210 may include a source region, a drain region and a channel region. The channel region may be disposed between the source region and the drain region. The source region and the drain region may have a resistance lower than the channel region. For example, the source region and the drain region may include a conductorized region of an oxide semiconductor.

The gate insulating layer 220 may be disposed on the semiconductor pattern 210. For example, the gate insulating layer 220 may overlap the channel region of the semiconductor pattern 210. The source region and the drain region of the semiconductor pattern 210 may be disposed outside the gate insulating layer 220. The gate insulating layer 220 may include an insulating material. For example, the gate insulating layer 220 may include an inorganic insulating material, such as silicon oxide (SiOx) and silicon nitride (SiNx).

The gate electrode 230 may be disposed on the gate insulating layer 220. For example, the gate electrode 230 may overlap the channel region of the semiconductor pattern 210. The gate electrode 230 may be insulated from the semiconductor pattern 210 by the gate insulating layer 220. For example, a side of the gate insulating layer 220 may be continuous with a side of the gate electrode 230. The gate electrode 230 may include a conductive material. For example, the gate electrode 230 may include a metal, such as aluminum (Al), titanium (Ti), copper (Cu), molybdenum (Mo), tantalum (Ta), chromium (Cr) and tungsten (W), or an alloy thereof. The channel region of the semiconductor pattern 210 may have an electric conductivity corresponding to a voltage applied to the gate electrode 230.

The source electrode 240 may include a conductive material. For example, the source electrode 240 may include a metal, such as aluminum (Al), titanium (Ti), copper (Cu), molybdenum (Mo), tantalum (Ta), chromium (Cr) and tungsten (W), or an alloy thereof. The source electrode 240 may include a single-layer structure or a multi-layer structure. The source electrode 240 may be insulated from the gate electrode 230. The source electrode 240 may be disposed on a layer different from the gate electrode 230. For example, an interlayer insulating layer 120 covering the gate electrode 230 may be disposed on the device substrate 100, and the source electrode 240 may be disposed on the interlayer insulating layer 120. The interlayer insulating layer 120 may include an insulating material. For example, the interlayer insulating layer 120 may include an inorganic insulating material, such as silicon oxide (SiOx) and silicon nitride (SiNx).

The source electrode 240 may be electrically connected to the source region of the semiconductor pattern 210. For example, the interlayer insulating layer 120 may include a source contact hole partially exposing the source region of the semiconductor pattern 210. The source electrode 240 may be in direct contact with the source region of the semiconductor pattern 210 through the source contact hole.

The drain electrode 250 may include a conductive material. For example, the drain electrode 250 may include a metal, such as aluminum (Al), titanium (Ti), copper (Cu), molybdenum (Mo), tantalum (Ta), chromium (Cr) and tungsten (W), or an alloy thereof. The drain electrode 250 may have a single-layer structure or a multi-layer structure. The drain electrode 250 may be insulated from the gate electrode 230. The drain electrode 250 may be disposed on a layer different from the gate electrode 230. For example, the drain electrode 250 may be disposed on the interlayer insulating layer 120. The drain electrode 250 may be disposed on the same layer as the source electrode 240. The drain electrode 250 may include the same material as the source electrode 240. The drain electrode 250 may be formed by the same process as the source electrode 240. For example, the drain electrode 250 may be formed simultaneously with the source electrode 240.

The drain electrode 250 may be electrically connected to the drain region of the semiconductor pattern 210. For example, the interlayer insulating layer 120 may include a drain contact hole partially exposing the drain region of the semiconductor pattern 210. The drain electrode 250 may be in direct contact with the drain region of the semiconductor pattern 210 through the drain contact hole.

The first thin film transistors T1 may have the same structure as the second thin film transistor T2. For example, the first thin film transistor T1 may include a gate electrode electrically connected to the corresponding gate line GL, a source electrode electrically connected to the corresponding data line DL, and a drain electrode electrically connected to the gate electrode 230 of the second thin film transistor T2. The source electrode 240 of the second thin film transistor T2 may be connected to one of the power voltage supply lines PL. The storage capacitor Cst may maintain a signal applied to the gate electrode 230 of the second thin film transistor T2. For example, the storage capacitor Cst may be connected between the gate electrode 230 and the drain electrode 250 of the second thin film transistor T2.

A device buffer layer 110 may be disposed between the device substrate 100 and the pixel driving circuit DC of each pixel area PA. The device buffer layer 110 may prevent pollution due to the device substrate 100 in a process of forming the pixel driving circuits DC. For example, an upper surface of the device substrate 100 toward the pixel driving circuit DC of each pixel area PA may be completely covered by the device buffer layer 110. The device buffer layer 110 may include an insulating material. For example, the device buffer layer 110 may include an inorganic insulating material, such as silicon oxide (SiOx) and silicon nitride (SiNx). The device buffer layer 110 may include a multi-layer structure. For example, the device buffer layer 110 may have a stacked structure of an inorganic insulating layer made of silicon oxide (SiOx) and an inorganic insulating layer made of silicon nitride (SiNx).

The planarization layer 130 may be disposed between the pixel driving circuit DC and the light-emitting device 300 of each pixel area PA. The planarization layer 130 may remove a thickness difference due to the pixel driving circuit DC of each pixel area PA. For example, an upper surface of the planarization layer 130 opposite to the device substrate 100 may be a flat surface. The first thin film transistor T1, the second thin film transistor T2 and the storage capacitor Cst in each pixel area PA may be covered by the planarization layer 130. For example, the planarization layer 130 may be in direct contact with the interlayer insulating layer 120 at the outside of the first thin film transistor T1, the second thin film transistor T2 and the storage capacitor Cst in each pixel area PA. The planarization layer 130 may include an insulating material. The planarization layer 130 may include a material different from the interlayer insulating layer 120. For example, the planarization layer 130 may include an organic insulating material.

The first electrode 310 of each pixel area PA may be electrically connected to the pixel driving circuit DC of the corresponding pixel area PA by penetrating the planarization layer 130. For example, the planarization layer 130 may include pixel contact holes partially exposing the drain electrode 250 of the second thin film transistor T2 in each pixel area PA. The first electrode 310 of each pixel area PA may be in direct contact with the drain electrode 250 of the second thin film transistor T2 in the corresponding pixel area PA through one of the pixel contact holes.

The first electrode 310 of each pixel area PA may be insulated from the first electrode 310 of adjacent pixel area PA. The first electrode 310 of each pixel area PA may be spaced away from the first electrode 310 of adjacent pixel area PA. For example, a bank insulating layer 140 may be disposed between the first electrodes 310 of adjacent pixel areas PA. The bank insulating layer 140 may include an insulating material. For example, the bank insulating layer 140 may include an organic insulating material. The bank insulating layer 140 may cover an edge of the first electrode 310 in each pixel area PA. The light-emitting layer 320 and the second electrode 330 of each pixel area PA may be stacked on a portion of the corresponding first electrode 310 exposed by the bank insulating layer 140. For example, the bank insulating layer 140 may define emission area EA.

The light-emitting device 300 of each pixel area PA may have the same structure as the light-emitting device 300 of adjacent pixel area PA. For example, the light-emitting layer 320 of each pixel area PA may be in direct contact with the light-emitting layer 320 of adjacent pixel area PA by extending along a surface of the bank insulating layer 140. The light emitted from the light-emitting device 300 of each pixel area PA may display the same color as the light emitted from the light-emitting device 300 of adjacent pixel area PA. For example, the light-emitting layer 320 of each pixel area PA may emit white light. The light-emitting layer 320 of each pixel area PA may be formed simultaneously with the light-emitting layer 320 of adjacent pixel area PA. Thus, in the display apparatus according to the embodiment of the present disclosure, a process of forming the light-emitting layer 320 of each pixel area PA may be simplified.

A voltage applied to the second electrode 330 of each pixel area PA may be the same as a voltage applied to the second electrode 330 of adjacent pixel area PA. Thus, in the display apparatus according to the embodiment of the present disclosure, the luminance of the light emitted from the light-emitting device 300 of each pixel area PA may be controlled by the data signal applied to the corresponding pixel area PA. The second electrode 330 of each pixel area PA may be electrically connected to the second electrode 330 of adjacent pixel area PA. For example, the second electrode 330 of each pixel area PA may be in direct contact with the second electrode 330 of adjacent pixel area PA by extending along the surface of the bank insulating layer 140. The second electrode 330 of each pixel area PA may be formed simultaneously with the second electrode 330 of adjacent pixel area PA. Thus, in the display apparatus according to the embodiment of the present disclosure, a process of forming the second electrode 330 of each pixel area PA may be simplified.

An encapsulating unit 400 (e.g., an encapsulating layer) may be disposed on the light-emitting device 300 of each pixel area PA. The encapsulating unit 400 may prevent or at least reduce the damage of the light-emitting devices 300 due to external moisture and/or oxygen. The encapsulating unit 400 may include an inorganic encapsulating layers 410 and 430, and at least one organic encapsulating layer 420. For example, the encapsulating unit 400 may have a structure in which at least one organic encapsulating layer 420 is disposed between the inorganic insulating layers 410 and 430. Thus, in the display apparatus according to the embodiment of the present disclosure, the penetration of the external moisture and oxygen may be effectively blocked or at least reduced.

The inorganic encapsulating layers 410 and 430 may include an inorganic insulating material. For example, the inorganic encapsulating layers 410 and 430 may include an inorganic insulating material capable of low-temperature deposition, such as silicon nitride (SiNx), silicon oxide (SiOx), silicon oxynitride ($SiO_xN$), and aluminum oxide (Al2O3). Thus, in the display apparatus according to the embodiment of the present disclosure, the damage of the light-emitting layer 320 due to a process of forming the inorganic insulating layer 410 and 430 may be prevented or at least reduced.

The organic encapsulating layer 420 may relieve a stress due to the inorganic encapsulating layers 410 and 430. For example, the organic encapsulating layer 420 may include an organic insulating material such as acrylic resin, epoxy resin, polyimide, polyethylene, and silicon oxycarbide ($SiO_xC$). A thickness difference due to the light-emitting devices 300 may be removed by the organic encapsulating layer 420. For example, an upper surface of the organic encapsulating layer 420 opposite to the device substrate 100 may be a flat surface.

The pixel areas PA may display various colors. For example, the pixel areas PA may include red pixel areas RPA displaying red color, white pixel areas WPA displaying white color, blue pixel areas BPA displaying blue color, and green pixel areas GPA displaying green color, as shown in FIG. 3. The red pixel areas RPA, the white pixel areas WPA, the blue pixel areas BPA and the green pixel areas GPA may be repeatedly arranged in a direction. Each of pixel columns CL including the pixel areas PA disposed side by side in a first direction (e.g., column direction or vertical direction) may display one color. For example, each of the pixel columns CL may comprise of one of the red pixel areas RPA, the white pixel areas WPA, the blue pixel areas BPA, and the green pixel areas GPA, and each of the pixel columns CL may display a different color from the adjacent pixel column CL in a second direction perpendicular (e.g., a row direction or horizontal direction) to the first direction. The red pixel areas RPA, the white pixel areas WPA, the blue pixel areas BPA and the green pixel areas GPA may be repeatedly arranged in the second direction. Thus, in the display apparatus according to the embodiment of the present disclosure, the image made of various colors may be displayed.

Color filters 500R and separating dams 600 may be disposed on the encapsulating unit 400. The color filters 500R may overlap the pixel areas PA. For example, the light emitted from each light-emitting device 300 may be emitted outside through one of the color filters 500R. The separating dams 600 may be disposed outside the pixel areas PA. Thus, the separating dams 600 are non-overlapping with the pixel areas PA. For example, each of the separating dams 600 may extend in the first direction or the second direction between the pixel areas PA. The color filters 500R may be formed by an ink-jet process. For example, the separating dams 600 may define a formation region of each color filter 500R.

The separating dams 600 may include first separation dams 610 extending in the first direction between the pixel areas PA, and second separation dams 620 extending in the second direction between the pixel areas PA. For example, the first separation dams 610 may be disposed between the pixel areas PA realizing different colors, and the second separation dams 620 may be disposed between the pixel areas PA realizing the same color. The second separation dams 620 may be disposed between the first separation dams 610. As shown in FIG. 3, each pixel area PA is between a corresponding portion of a pair of first separation dams 610 and a pair of second separation dams 620.

The first separation dams 610 and the second separation dams 620 may include an insulating material. For example, the first separation dams 610 and the second separation dams 620 may include an organic insulating material. The second separation dams 620 may be formed by the same process as the first separation dams 610. The second separation dams 620 may be formed simultaneously with the first separation dams 610. For example, the second separation dams 620 may include the same material as the first separation dams 610.

In one embodiment, the second separation dams 620 may include first dam patterns 621 and second dam patterns 622. The first dam patterns 621 may completely cross between adjacent first separation dams 610. That is, the first dam patterns 621 intersect multiple first separation dams 610. Each of the first dam patterns 621 may be in direct contact with adjacent first separation dams 610. That is, a first dam pattern 621 may extend between a pair of adjacent first separation dams 610 such that a first end of the first dam pattern 621 is in contact with a first separation dam 610 from the pair and a second end of the first dam pattern 621 is in contact with another first separation dam 610 from the pair. For example, a length 621*d* of each first dam pattern 621 in the second direction may be the same as a straight distance between a pair of first separation dams 610 in the second direction.

A length 622*d* of each second dam pattern 622 may be shorter than the length 621*d* of each first dam pattern 621, as shown in FIG. 3. For example, the length 622*d* of each second dam pattern 622 in the second direction may be less than the straight distance between the first separation dams 610 in the second direction. Thus, a second dam pattern 621 has a first end that is connected to a first separation dam 610 and a second end that is not connected to an adjacent first separation dam 610. That is, in the display apparatus according to the embodiment of the present disclosure, two color filters 500R adjacent in the first direction may be connected to each other by the second dam patterns 622. The color filters 500R may be formed by an ink-jet process. Thus, in the display apparatus according to the embodiment of the present disclosure, the volume difference of the color filters 500R due to the volume difference and/or the amount difference of material injected into each region defined by the separating dams 600 for ink-jet process may be reduced.

An end portion of each second dam pattern 622 may be contact with one of the first separation dams 610. For example, each of the second dam patterns 622 may include an end portion disposed between the pixel areas PA disposed side by side in the first direction. A thickness 622*t* of each second dam pattern 622 may be less than a thickness 621*t* of each first dam pattern 621, as shown in FIG. 4. For example, the color filters 500R may have a thickness greater than the second dam patterns 622. Each of the second dam patterns 622 may partially cross the inside of the corresponding color filter 500R. Thus, the color filter 500R is in contact with the first dam patterns 621 and a second dam pattern 622 as shown in FIG. 4. More specifically, the color filter 500R is in contact with an uppermost surface of the second dam patterns 622 as shown in FIG. 4. Thus, in the display apparatus according to the embodiment of the present disclosure, the volume difference between the color filters 500R may be effectively reduced. And, in the display apparatus according to the embodiment of the present disclosure, the surface sag of each color filter 500R may be prevented or at least reduced between the first dam patterns 621 by the second dam patterns 622 since the color filter 500R is over and in contact with the uppermost surface of the second dam patterns 622. That is, in the display apparatus according to the embodiment of the present disclosure, the upper surface of each color filter 500R opposite to the device substrate 100 may maintain a constant level. Therefore, in the display apparatus according to the embodiment of the present disclosure, the surface deviation between the color filters 500R may be prevented by the second dam patterns 622.

The second dam patterns 622 may be formed by the same process as the first dam patterns 621. The second dam patterns 622 may be formed simultaneously with the first dam patterns 621. For example, a width 622*w* of each second dam pattern 622 in the first direction may be the same as a width 621*w* of each first dam pattern 621 in the first direction. A lower surface of each second dam pattern 622 toward the device substrate 100 may have the same size as a lower surface of each first dam pattern 621 toward the device substrate 100. Thus, in the display apparatus according to the embodiment of the present disclosure, a process of forming the first dam patterns 621 and the second dam patterns 622 may be simplified.

The first dam patterns 621 and the second dam patterns 622 may be repeated at a specific period. That is, in the display apparatus according to the embodiment of the present disclosure, the second separation dams 620 in each pixel column CL may be partially open. Thus, in the display apparatus according to the embodiment of the present disclosure, spreading due to particles may be prevented.

The location of the second dam patterns 622 in each pixel column CL may be not uniform. The second dam patterns 622 in each pixel column CL may be disposed differently from the second dam patterns 622 of the pixel column CL realizing the same color as the corresponding pixel column CL. For example, the first dam patterns 621 and the second dam patterns 622 in each pixel column CL may be arranged to be shifted in the first direction from the first dam patterns 621 and the second dam patterns 622 in the pixel column CL displaying the same color as the corresponding pixel column CL. Thus, in the display apparatus according to the embodiment of the present disclosure, a moire phenomenon due to the same repetition of the second dam patterns 622 may be prevented.

A transparent passivation layer 700 may be disposed on the color filters 500R and the separation dams 600. The transparent passivation layer 700 may prevent the damage of the color filters 500R due to the external moisture and impact. For example, the transparent passivation layer 700 may include an insulating material.

Accordingly, in the display apparatus according to the embodiment of the present disclosure, the color filters 500R displaying the same color may be disposed on the pixel areas PA disposed side by side in the first direction, wherein some of the second separation dams 620 extending in the second direction perpendicular to the first direction among the separating dams 600, which define the formation region of the color filters 500R may be open. Thus, in the display apparatus according to the embodiment of the present disclosure, the volume difference between the color filters 500R formed by the ink-jet process may be reduced. Therefore, in the display apparatus according to the embodiment of the present disclosure, the quality of the image may be improved.

Figure 5:
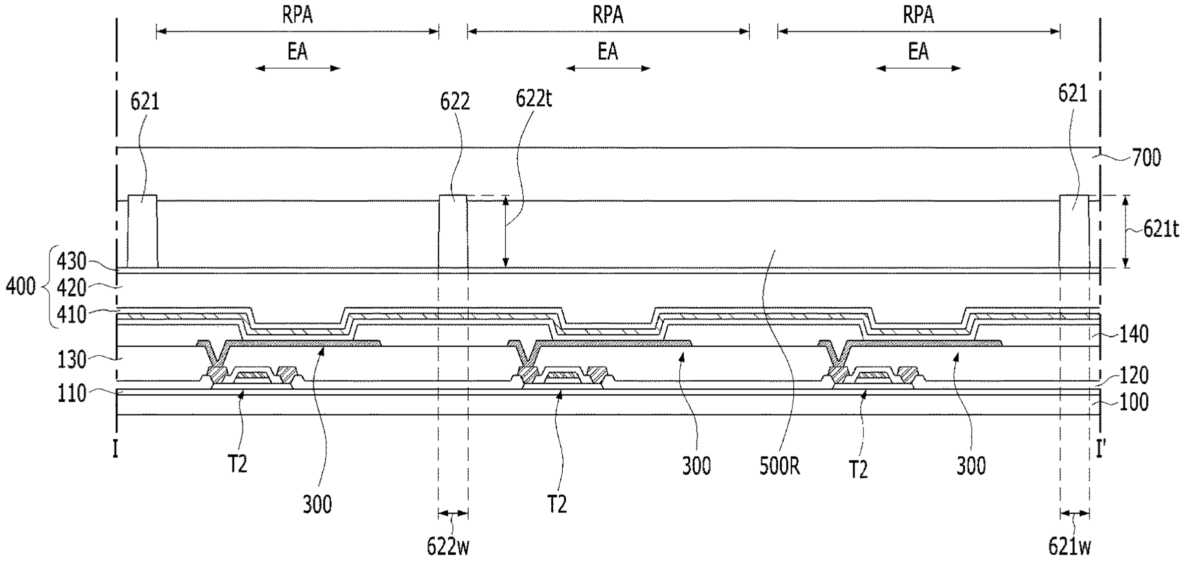
FIG. 5 is a view taken along I-I' of FIG. 3 according to another embodiment of the present disclosure.

The display apparatus according to the embodiment of the present disclosure is described that the length 622*d* and the thickness 622*t* of each second dam pattern 622 are smaller than the length 621*d* and the thickness 621*t* of each first dam pattern 621. However, in the display apparatus according to another embodiment of the present disclosure, the thickness 622*t* of each second dam pattern 622 may be the same as the thickness 621*t* of each first dam pattern 621, as shown in FIG. 5. Thus, in contrast to FIG. 4, the color filters 500R are non-overlapping with the uppermost surface of the second dam pattern 622 as shown in FIG. 5. That is, in the display apparatus according to another embodiment of the present disclosure, the volume difference between the color filters 500R may be reduced by a spaced area between each second dam pattern 622 and the first separation dams 610. Thus, in the display apparatus according to another embodiment of the present disclosure, a process of forming the second separation dams 620 may be simplified.

Figure 6:
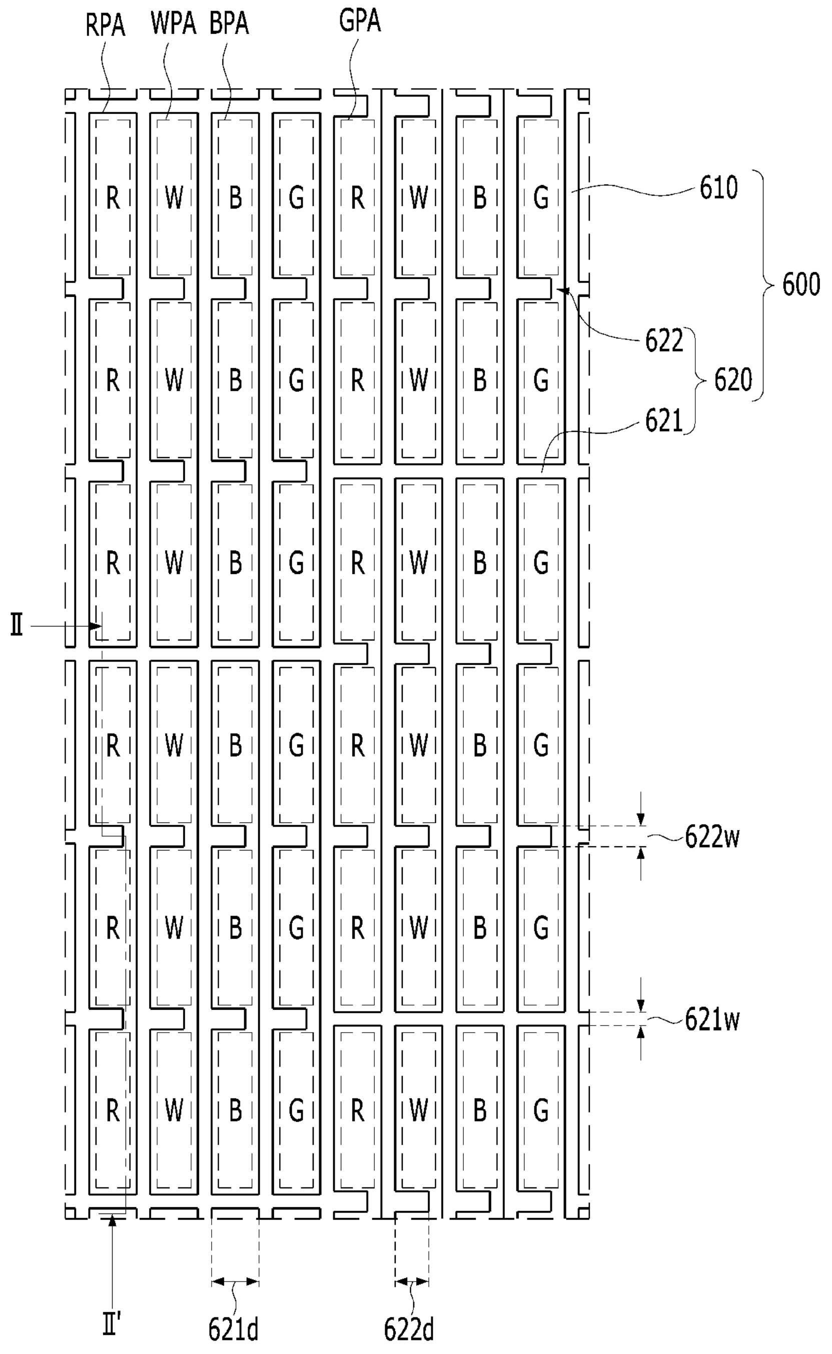
FIG. 6 is a view showing separating dams and color filters in the display apparatus according to another embodiment of the present disclosure.
Figure 7:
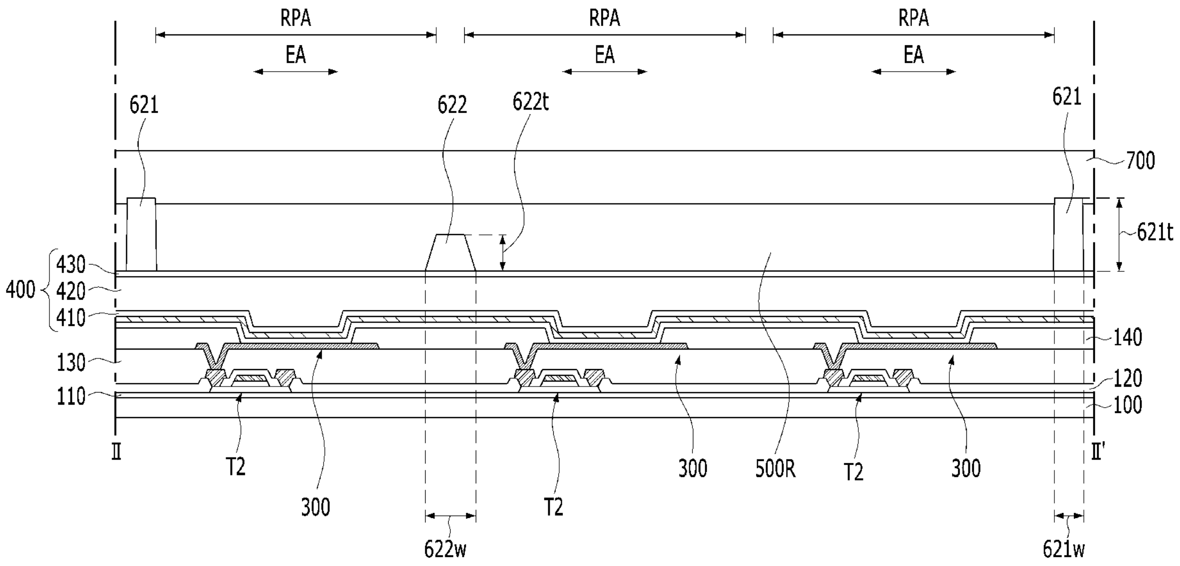
FIG. 7 is a view taken along II-II' of FIG. 6 according to an embodiment of the present disclosure.

The display apparatus according to the embodiment of the present disclosure is described that the width 622*w* of each second dam pattern 622 is the same as the width 621*w* of each first dam pattern 621. However, in the display apparatus according to another embodiment of the present disclosure, each of the second dam patterns 622 may have a width that is different from the width of each first dam pattern 621. For example, in the display apparatus according to another embodiment of the present disclosure, the width 622*w* of each second dam pattern 622 may be greater than the width 621*w* of each first dam pattern 621, as shown in FIGS. 6 and 7. A side of each second dam pattern 622 may have a slope that is different from a slope of a side of each first dam pattern 621. For example, the side of each second dam pattern 622 may have a gentler slope (e.g., less sloped) than the slope of the side of each first dam pattern 621. An upper surface of each second dam pattern 622 opposite to the device substrate 100 may have a size different from an upper surface of each first dam pattern 621 opposite to the device substrate 100. Thus, in the display device according to another embodiment of the present disclosure, the color filters 500R may be easily moved around each second dam pattern 622. Therefore, in the display device according to another embodiment of the present disclosure, the volume difference between the color filters 500R may be effectively reduced by the second dam patterns 622.

Figure 8:
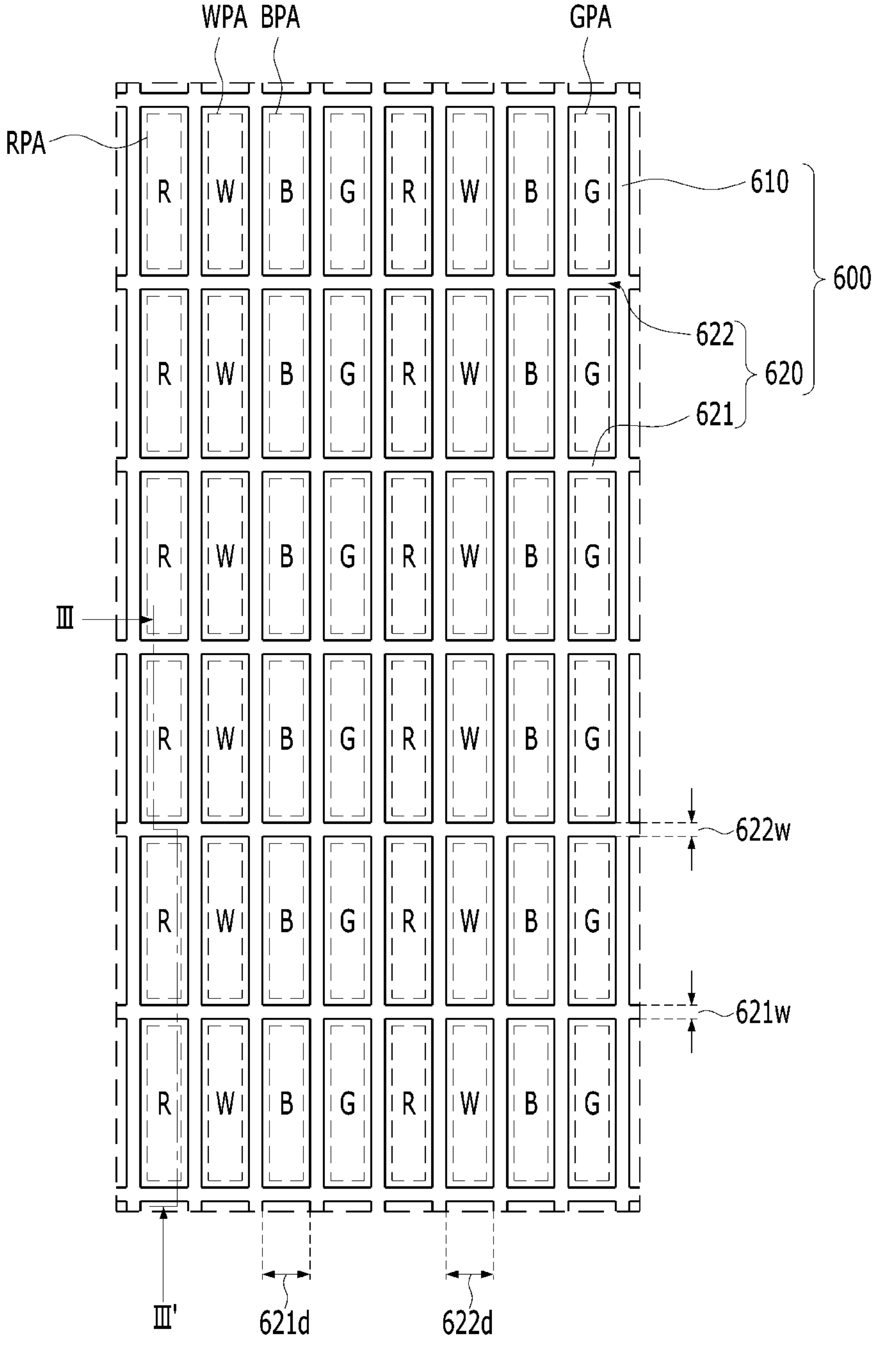
FIG. 8 is a view showing separating dams and color filters in the display apparatus according to another embodiment of the present disclosure.
Figure 9:
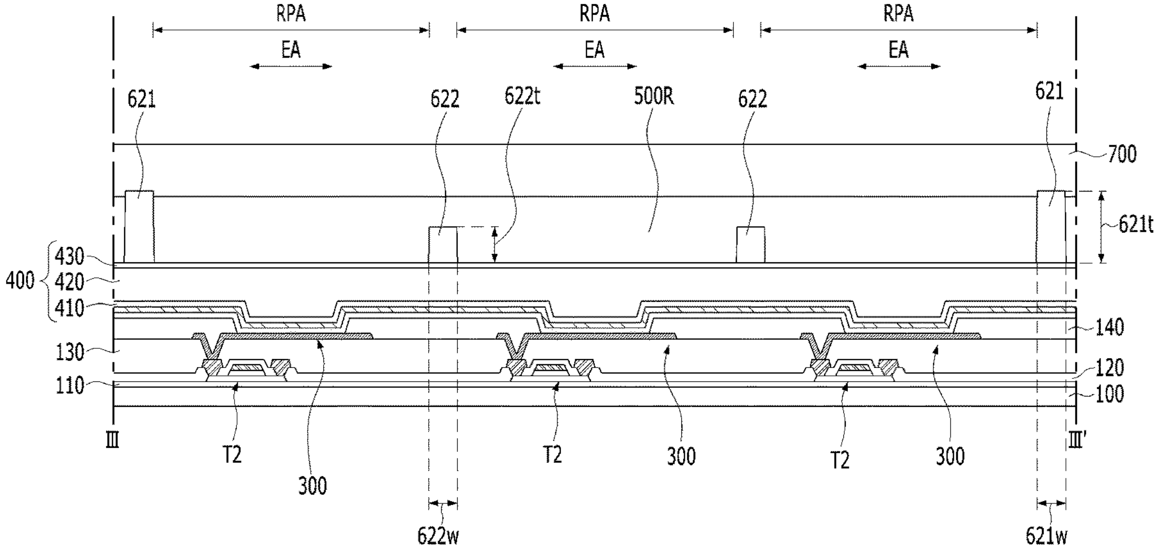
FIG. 9 is a view taken along of FIG. 8 according to an embodiment of the present disclosure.

The display apparatus according to the embodiment of the present disclosure is described that an end portion of each second dam pattern 622 is spaced away (apart) from the first separation dams 610. However, in the display apparatus according to another embodiment of the present disclosure, each of the first dam patterns 621 and the second dam patterns 622 may completely cross the corresponding color filter 500R. For example, in the display apparatus according to another embodiment of the present disclosure, the length 622*d* of each second dam pattern 622 may be the same as the length 621*d* of each first dam pattern 621, and the thickness 622*t* of each second dam pattern 622 may be less than the thickness 621*t* of each first dam pattern 621, as shown in FIGS. 8 and 9. Thus, in the display apparatus according to another embodiment of the present disclosure, the color filter 500R injected into each pixel area PA may flow into the adjacent pixel area PA beyond the second dam patterns 622. Therefore, in the display apparatus according to another embodiment of the present disclosure, the volume difference between the color filters 500R may be reduced by the second dam patterns 622.

Figure 10:
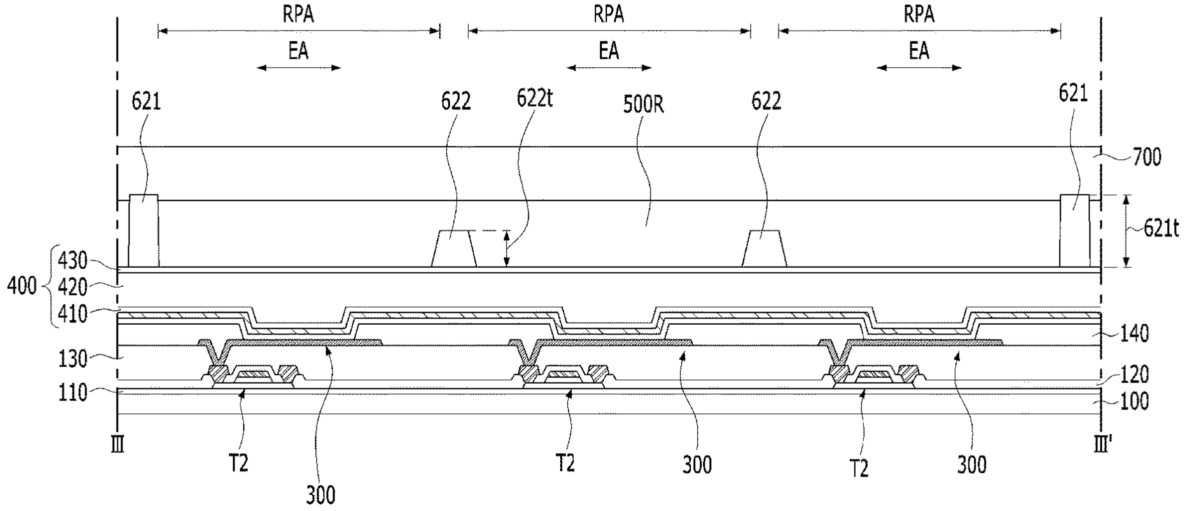
FIG. 10 is a view taken along of FIG. 8 according to another embodiment of the present disclosure.

In the display apparatus according to another embodiment of the present disclosure, a side of each second dam pattern 622 may have a gentler slope (e.g., less sloped) than a slope of a side of each first dam pattern 621, as shown in FIG. 10. Thus, in the display apparatus according to another embodiment of the present disclosure, the volume difference between the color filters 500R may be effectively reduced by the second dam patterns 622.

Figure 11:
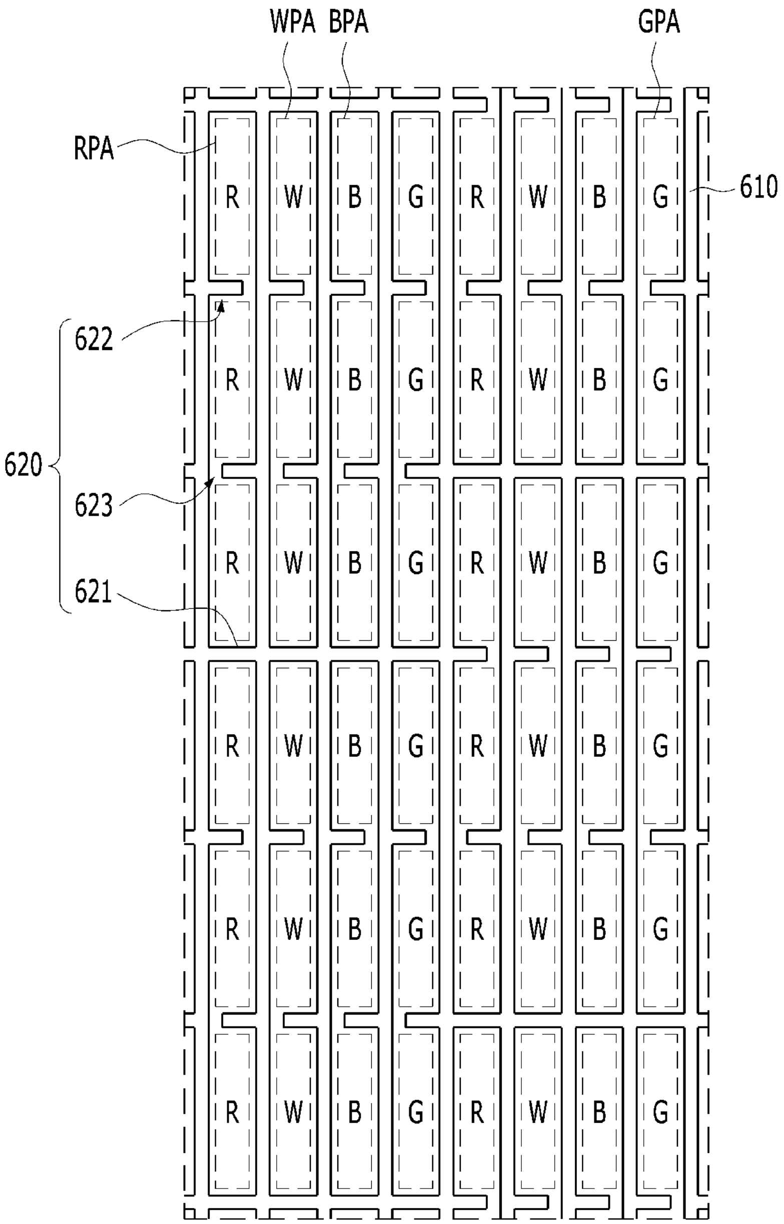
FIG. 11 is a view showing separating dams and color filters in the display apparatus according to another embodiment of the present disclosure.

The display apparatus according to the embodiment of the present disclosure is described that the second dam patterns 622 in each pixel column CL contact the same first separation dam 610. However, in the display apparatus according to another embodiment of the present disclosure, the second separation dams 620 in each pixel column CL may include the first dam patterns 621, the second dam patterns 622 and third dam patterns 623 that are alternately arranged, as shown in FIG. 11. The second dam patterns 622 and the third dam patterns 623 may have a length that is shorter than a length of the first dam patterns 621. For example, a length of each third dam pattern 623 in the second direction may be the same as the length of each second dam pattern 622. An end portion of each third dam pattern 623 may extend in an opposite direction (e.g., left) along the second direction than a direction of extension of an end portion of each second dam pattern 622 (e.g., right). For example, the area opened by the second dam patterns 622 may be arranged to be alternated with the area opened by the third dam patterns 623. As shown in FIG. 11, a third dam pattern 623 is between a first dam pattern 621 and a second dam pattern 622 in the first direction. Thus, in the display device according to another embodiment of the present disclosure, the volume difference between the color filters 500R may be reduced, and spreading due to particles may be effectively prevented.

Figure 12:
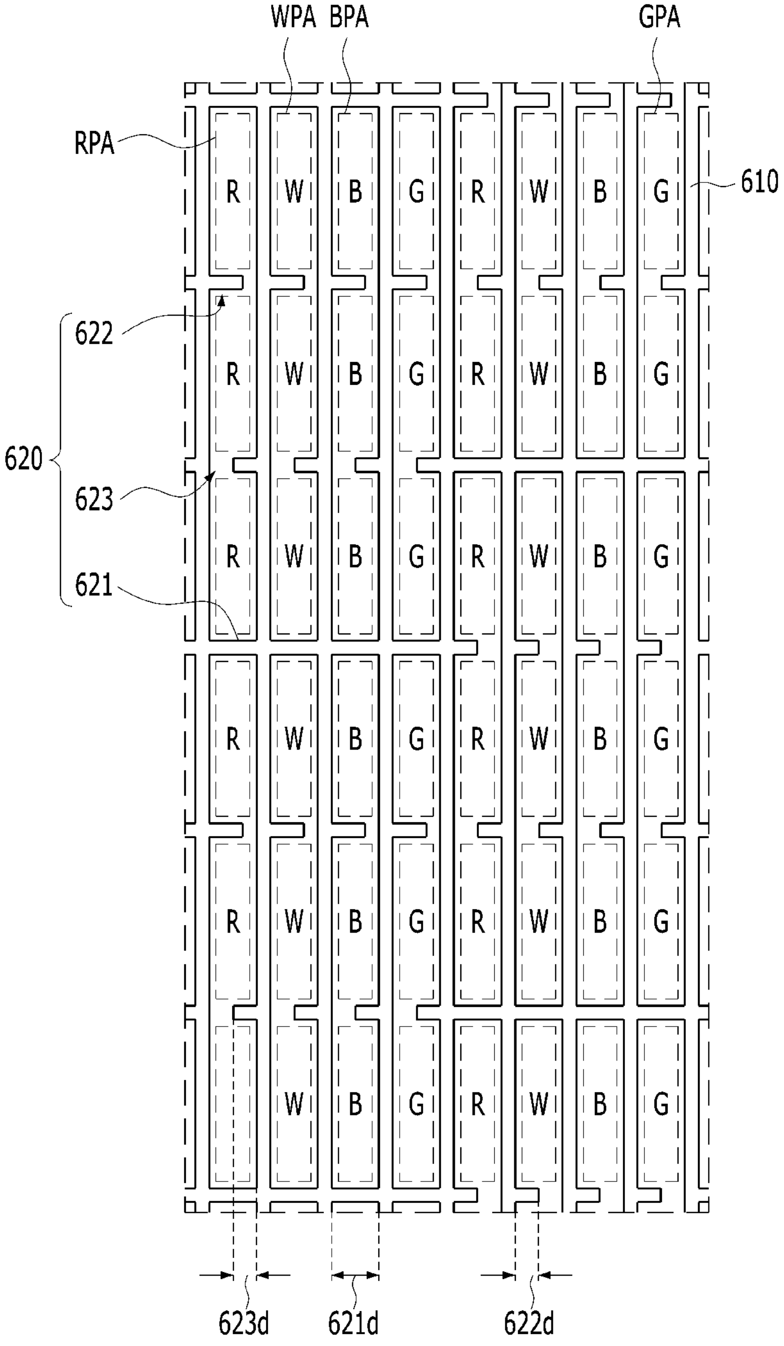
FIG. 12 is a view showing separating dams and color filters in the display apparatus according to another embodiment of the present disclosure.

The display apparatus according to the embodiment of the present disclosure is described that the second dam patterns 622 have the same length. However, in the display apparatus according to another embodiment of the present disclosure, spaces having various sizes may be formed between the first separation dams 610 and the second separation dams 620. For example, in the display apparatus according to another embodiment of the present disclosure, the second separation dams 620 disposed in each pixel column CL may include the first dam patterns 621, the second dam patterns 622 and the third dam patterns 623, which are alternately disposed in the first direction, wherein the length 621*d* of each first dam pattern 621, the length 622*d* of each second dam pattern 622, and the length 623*d* of each third dam pattern 623 may be different from each other as shown in FIG. 12. Thus, in the display apparatus according to another embodiment of the present disclosure, the volume difference between the color filters 500R may be effectively reduced by the second dam patterns 622.

Figure 13:
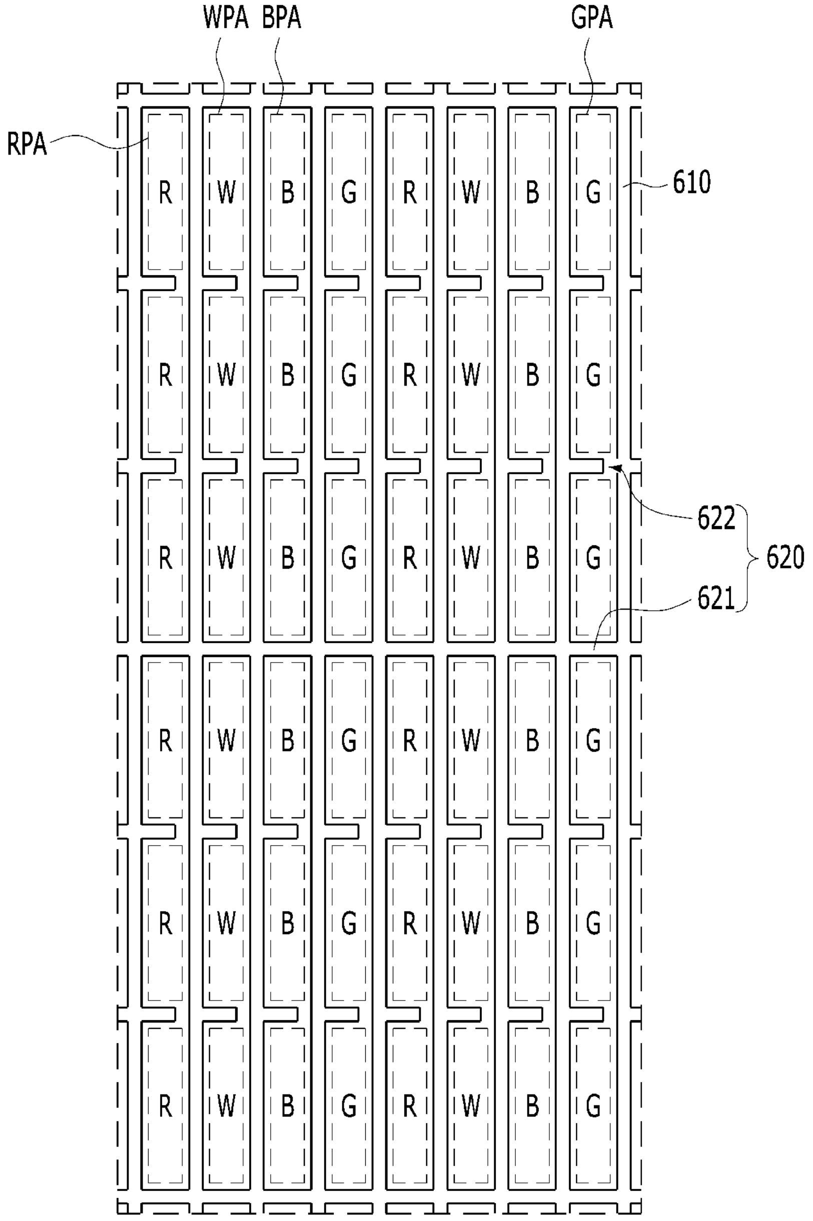
FIG. 13 is a view showing separating dams and color filters in the display apparatus according to another embodiment of the present disclosure.

In the display apparatus according to another embodiment of the present disclosure, the location of the second dam patterns 622 in each pixel column CL may be constant, as shown in FIG. 13. For example, the second dam patterns 622 of each pixel column CL may be disposed to be the same as the second dam patterns 622 of the adjacent pixel column CL. Thus, in the display apparatus according to another embodiment of the present disclosure, a process of forming the separating dams 600 may be simplified. Therefore, in the display apparatus according to another embodiment of the present disclosure, the volume difference between the color filters 500R may be reduced, without lowering the process efficiency.

In the result, the display apparatus according to the embodiments of the present disclosure may include the light-emitting devices on the pixel areas of the device substrate, the encapsulating unit covering the light-emitting devices, the separating dams disposed on the encapsulating unit, and the color filters formed between the separating dams, wherein the separating dams may be disposed outside the pixel areas, wherein some of the separating dams disposed between the pixel areas, which realize the same color, may have a relatively short length. Thus, in the display apparatus according to the embodiments of the present disclosure, the volume difference between the color filters, which are disposed on the pixel area realizing the same color, may be reduced. Thereby, in the display apparatus according to the embodiments of the present disclosure, the quality of the image may be improved.

What is claimed is:

1. A display apparatus comprising:

a plurality of first separation dams extending in a first direction, the plurality of first separation dams spaced apart from each other in a second direction that is different from the first direction;

a first pixel column including a plurality of first pixel areas between the plurality of first separation dams, the plurality of first pixel areas arranged along the first direction between the plurality of first separation dams;

a plurality of first dam patterns between the plurality of first pixel areas, the plurality of first dam patterns extending in the second direction;

a plurality of second dam patterns between the plurality of first pixel areas, the plurality of second dam patterns extending in the second direction and each of the plurality of second dam patterns having a length that is less than a length of each of the plurality of first dam patterns;

a second pixel column spaced apart from the first pixel column in the second direction, the second pixel column including a plurality of second pixel areas between the plurality of first separation dams, the plurality of second pixel areas arranged along the first direction between the plurality of first separation dams; and a plurality of first color filters between the plurality of first separation dams, the plurality of first dam patterns, and the plurality of second dam patterns, wherein a set of first dam patterns and a set of second dam patterns between the plurality of second pixel areas has a different arrangement from a set of first dam patterns and a set of second dam patterns between the plurality of first pixel areas, wherein each of the plurality of first dam patterns includes a first end that is in contact with one first separation dam from a pair of adjacent first separation dams in the second direction and a second end that is in contact with the other first separation dam from the pair of adjacent first separation dams, such that a first pair of adjacent first color filters in the first direction is separated by one of the plurality of first dam patterns, and wherein a second pair of adjacent first color filters in the first direction is connected to each other across a region adjacent in the second direction to one of the plurality of second dam patterns.

2. The display apparatus according to claim 1, wherein an end portion of each of the plurality of second dam patterns is between the plurality of first separation dams.

3. The display apparatus according to claim 1, further comprising:

a plurality of third dam patterns between the plurality of first pixel areas, each of the plurality of third dam patterns having a length that is less than the length of each of the plurality of first dam patterns, wherein an end portion of each of the plurality of third dam patterns extends in a direction along the second direction that is opposite to a direction of extension of an end portion of each of the plurality of second dam patterns.

4. The display apparatus according to claim 3, wherein a third dam pattern from the plurality of third dam patterns is between a first dam pattern from the plurality of first dam patterns and a second dam pattern from the plurality of second dam patterns in the first direction.

5. The display apparatus according to claim 3, wherein a length of each of the plurality of third dam patterns in the second direction is the same as the length of each of the plurality of second dam patterns in the second direction.

6. The display apparatus according to claim 3, wherein a width of each of the plurality of third dam patterns in the first direction is the same as a width of each of the plurality of second dam patterns in the first direction.

7. The display apparatus according to claim 3, wherein the plurality of first dam patterns, the plurality of second dam patterns, and the plurality of third dam patterns are alternately arranged in the first direction.

8. The display apparatus according to claim 1, wherein the plurality of first pixel areas display a same color.

9. The display apparatus according to claim 1, further comprising:

a plurality of second color filters on the plurality of second pixel areas, wherein the plurality of second color filters include a same material as the plurality of first color filters.

10. The display apparatus according to claim 1, wherein a maximum thickness of each of the plurality of second dam patterns is less than a maximum thickness of each of the plurality of first dam patterns.

11. The display apparatus according to claim 10, wherein each of the plurality of first color filters has a thickness that is greater than a thickness of each of the plurality of second dam patterns.

12. The display apparatus according to claim 10, wherein a side of each of the plurality of second dam patterns has a slope that is less than a slope of a side of each of the plurality of first dam patterns.

13. A display apparatus comprising:

a plurality of light-emitting devices on a device substrate;

an encapsulating layer on the plurality of light-emitting devices;

a plurality of separating dams on the encapsulating layer, the plurality of separating dams including a plurality of first separation dams extending in a first direction and a plurality of second separation dams extending in a second direction that is different from the first direction, the plurality of second separation dams between the plurality of first separation dams; and a plurality of color filters between the plurality of separating dams, the plurality of color filters overlapping the plurality of light-emitting devices, wherein each of a plurality of regions defined by the plurality of first separation dams and the plurality of second separation dams is filled by one of the plurality of color filters, wherein the plurality of second separation dams include a plurality of first dam patterns and a plurality of second dam patterns between the plurality of first dam patterns in the first direction, wherein a set of first dam patterns and a set of second dam patterns between a pair of first separation dams has a different arrangement from a set of first dam patterns and a set of second dam patterns between an adjacent pair of first separation dams, wherein each of the plurality of first dam patterns has a thickness in a third direction perpendicular to the first direction and the second direction that is greater than a thickness of each of the plurality of color filters, and wherein each of the plurality of second dam patterns has a thickness that is less than the thickness of each of the plurality of first dam patterns.

14. The display apparatus according to claim 13, wherein a side of each of the plurality of second dam patterns has a slope that is less than a slope of a side of each of the plurality of first dam patterns.

15. The display apparatus according to claim 14, wherein a width of each of the plurality of second dam patterns is greater than a width of each of the plurality of first dam patterns.

16. A display apparatus comprising:

a substrate;

a first pair of first separation dams on the substrate, the first pair of first separation dams extending in a first direction and spaced apart from each other in a second direction that is different from the first direction;

a second pair of first separation dams on the substrate, the second pair of first separation dams extending in the first direction and spaced apart from each other in the second direction;

a plurality of second separation dams between the first pair of the first separation dams and between the second pair of the first separation dams, each of the plurality of second separation dams extending between the first pair of first separation dams and between the second pair of first separation dams;

a plurality of pixel areas arranged in the first direction and configured to emit a same color of light, each pixel area from the plurality of pixel areas between a corresponding portion of the first pair or the second pair of first separation dams and a pair of second separation dams from the plurality of second separation dams; and a plurality of color filters on the plurality of pixel areas, wherein the plurality of second separation dams include:

a plurality of first dam patterns, each first dam pattern from the plurality of first dam patterns including a first end that is connected to one first separation dam from the pair of adjacent first separation dams in the second direction and a second end that is connected to another first separation dam from the pair of adjacent first separation dams, such that a first pair of adjacent color filters in the first direction is separated by one of the plurality of first dam patterns; and a plurality of second dam patterns, each second dam pattern from the plurality of second dam patterns including a first end that is connected to the one first separation dam from the pair of first separation dams and a second end that is not connected to the other first separation dam from the pair of first separation dams, wherein a set of first dam patterns and a set of second dam patterns between the first pair of first separation dams has a different arrangement from a set of first dam patterns and a set of second dam patterns between the second pair of first separation dams, wherein each of the plurality of color filters is in contact with the pair of first separation dams, at least one first dam pattern from the plurality of first dam patterns, and at least one second dam pattern from the plurality of second dam patterns, and wherein a second pair of adjacent first color filters in the first direction is connected to each other across a region adjacent in the second direction to one of the plurality of second dam patterns.

17. The display apparatus of claim 16, wherein a thickness of each of the plurality of first dam patterns is the same as a thickness of each of the plurality of second dam patterns, and the plurality of color filters is non-overlapping with an uppermost surface of each of the plurality of second dam patterns.

18. The display apparatus of claim 16, wherein a maximum width of each of the plurality of first dam patterns in the first direction is the same as a maximum width of each of the plurality of second dam patterns in the first direction.

19. The display apparatus of claim 16, wherein the plurality of second separation dams further include:

a plurality of third dam patterns between the plurality of pixel areas, each third dam pattern from the plurality of third dam patterns including a first end that is connected to one of the pair of first separation dams and a second end that is not connected to another one of the pair of first separation dams, wherein the second end of each third dam pattern extends in a direction along the second direction that is opposite to a direction of extension of the second end of each second dam pattern, and wherein a maximum length of a second dam pattern from the plurality of second dam patterns is different from a maximum length of a third dam pattern from the plurality of third dam patterns.

* * * * *